United States Patent
Sherpa et al.

(10) Patent No.: US 10,658,192 B2
(45) Date of Patent: *May 19, 2020

(54) SELECTIVE OXIDE ETCHING METHOD FOR SELF-ALIGNED MULTIPLE PATTERNING

(71) Applicant: Tokyo Electron Limited, Minato-ku, Tokyo (JP)

(72) Inventors: Sonam D. Sherpa, Albany, NY (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 156 days.

This patent is subject to a terminal disclaimer.

(21) Appl. No.: 16/120,554

(22) Filed: Sep. 4, 2018

(65) Prior Publication Data

US 2019/0080925 A1 Mar. 14, 2019

Related U.S. Application Data

(60) Provisional application No. 62/558,195, filed on Sep. 13, 2017.

(51) Int. Cl.
  *H01L 21/02* (2006.01)
  *H01L 21/033* (2006.01)
  *H01L 21/311* (2006.01)

(52) U.S. Cl.
  CPC .... *H01L 21/31116* (2013.01); *H01L 21/0234* (2013.01); *H01L 21/0332* (2013.01); *H01L 21/0337* (2013.01); *H01L 21/31144* (2013.01)

(58) Field of Classification Search
  CPC ........... H01L 21/31116; H01L 21/0234; H01L 21/0337; H01L 21/0332; H01L 21/31144
  See application file for complete search history.

(56) References Cited

U.S. PATENT DOCUMENTS

| | | | | |
|---|---|---|---|---|
| 10,304,688 B2* | 5/2019 | Sherpa | ............... | H01L 21/3065 |
| 10,431,470 B2* | 10/2019 | Sherpa | ............ | H01L 21/32137 |
| 10,446,405 B2* | 10/2019 | Sherpa | ............ | H01L 21/31116 |
| 2008/0146029 A1* | 6/2008 | Baks | ................. | H01L 21/31116 438/671 |
| 2011/0253670 A1* | 10/2011 | Zhou | ................ | H01L 21/31116 216/47 |
| 2014/0295668 A1* | 10/2014 | Avasarala | ......... | H01L 21/31116 438/696 |
| 2014/0329390 A1* | 11/2014 | Inoue | ................ | H01J 37/32192 438/711 |
| 2015/0243485 A1* | 8/2015 | Baujon | ............ | H01J 37/32403 428/195.1 |
| 2018/0350620 A1* | 12/2018 | Zaitsu | ............... | H01L 21/30621 |
| 2019/0311900 A1* | 10/2019 | Pandit | ............... | H01L 21/67069 |

* cited by examiner

*Primary Examiner* — Savitri Mulpuri

(57) ABSTRACT

A method of etching is described. The method includes forming a first chemical mixture by plasma-excitation of a first process gas containing an inert gas and at least one additional gas selected from the group consisting of He and $H_2$, and exposing the first material on the substrate to the first chemical mixture to modify a first region of the first material. Thereafter, the method includes forming a second chemical mixture by plasma-excitation of a second process gas containing an inert gas and an additional gas containing C, H, and F, and exposing the first material on the substrate to the second plasma-excited process gas to selectively etch the first material, which contains silicon oxide, relative to the second material and remove the modified first material from the first region of the substrate.

20 Claims, 2 Drawing Sheets

SELECTIVE OXIDE ETCHING METHOD FOR SELF-ALIGNED MULTIPLE PATTERNING

CROSS REFERENCE TO RELATED APPLICATIONS

The present application claims the benefit of U.S. Provisional Patent Application No. 62/558,195, filed on Sep. 13, 2017, entitled "SELECTIVE OXIDE ETCHING METHOD FOR SELF-ALIGNED MULTIPLE PATTERNING," which is incorporated herein by reference in its entirety

FIELD OF INVENTION

The invention relates to a method for etching, and more particularly, a precision etch technique for etching a thin film for electronic device applications.

BACKGROUND OF THE INVENTION

The present invention relates to a method of manufacturing a semiconductor device such as an integrated circuit and transistors and transistor components for an integrated circuit. In the manufacture of a semiconductor device (especially on the microscopic scale), various fabrication processes are executed such as film-forming depositions, etch mask creation, patterning, material etching and removal, and doping treatments, are performed repeatedly to form desired semiconductor device elements on a substrate. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. With the delay of EUV (extreme ultraviolet) lithography, semiconductor device fabricators have extended conventional lithography using self-aligned multiple patterning techniques.

As device structures densify and develop vertically, the need for precision material etch becomes more compelling. Trade-offs between selectivity, profile, ARDE (aspect ratio dependent etching), and uniformity in plasma etch processes become difficult to manage. Current approaches to patterning and pattern transfer by balancing these trade-offs is not sustainable. The root cause for these trade-offs is the inability to control ion energy, ion flux, and radical flux independently. However, self-limiting processes, such as atomic layer etching (ALE), offer a viable route to escape these trade-offs by decoupling the etch process into sequential steps of surface modification and removal of modified surface regions, thereby allowing the segregation of the roles of radical flux and ion flux and energy.

SUMMARY

Techniques herein pertain to device fabrication using precision etch techniques.

A method of etching is described. The method of etching is described. The method includes forming a first chemical mixture by plasma-excitation of a first process gas containing an inert gas and at least one additional gas selected from the group consisting of He and $H_2$, and exposing the first material on the substrate to the first chemical mixture to modify a first region of the first material. Thereafter, the method includes forming a second chemical mixture by plasma-excitation of a second process gas containing an inert gas and an additional gas containing C, H, and F, and exposing the first material on the substrate to the second plasma-excited process gas to selectively etch the first material, which contains silicon oxide, relative to the second material and remove the modified first material from the first region of the substrate.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

DETAILED DESCRIPTION

Techniques herein pertain to device fabrication using precision etch techniques. Several instances manifest in semiconductor manufacturing in both front end of line (FEOL, e.g., transistor fabrication) through to the back end of line (BEOL, e.g., interconnect fabrication), where oxide and nitride films (typically silicon-containing, in nature) need to be etched with a high degree of precision.

Numerous fabrication sequences in semiconductor manufacturing demand precision etch techniques for both 2D (two-dimensional) and 3D (three-dimensional) device structures. Still, trilayer etch masks (e.g., including photoresist, anti-reflective coatings (ARC), organic carbon films) serve as the workhorse of patterning masks into the underlying layer. Current challenges involve obtaining pattern transfer with no loading artifacts, vertical sidewall profile and square bottom with immense selectivity to the intermediate layer(s). Continuous plasma etch process do not allow a solution to such challenges. And further, current challenges involve executing critical etch steps, including spacer etch, to reveal the mandrel-aligned multi-pattern.

According to various embodiments, precision cyclic plasma etching techniques using chemistries including low molecular weight noble gases, hydrogen and C, H and F-based chemistry are described for etching silicon oxide film (e.g., $SiO_x$, or $SiO_2$). When applied to self-aligned multiple patterning schemes, the spacer etch requires anisotropy and selectivity to the underlying film and the mandrel material, e.g., the conformally-applied silicon oxide layer should etch faster on the top of the mandrel and the bottom of open spaces between the mandrel pattern relative to other materials.

Figure 1:
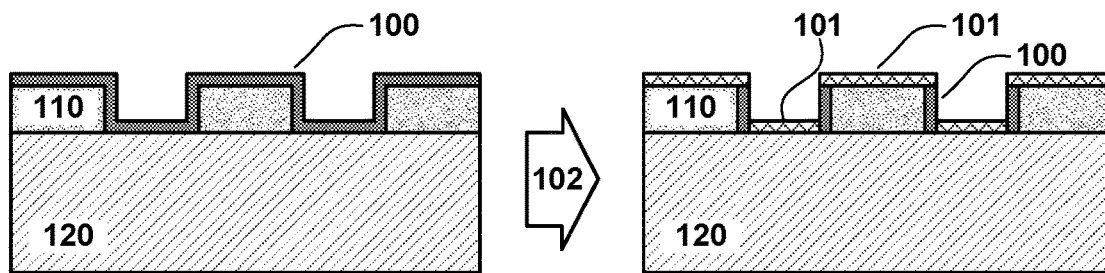
FIG. 1 illustrates a schematic representation of a method of etching a thin film on a substrate according to an embodiment.
Figure 2:
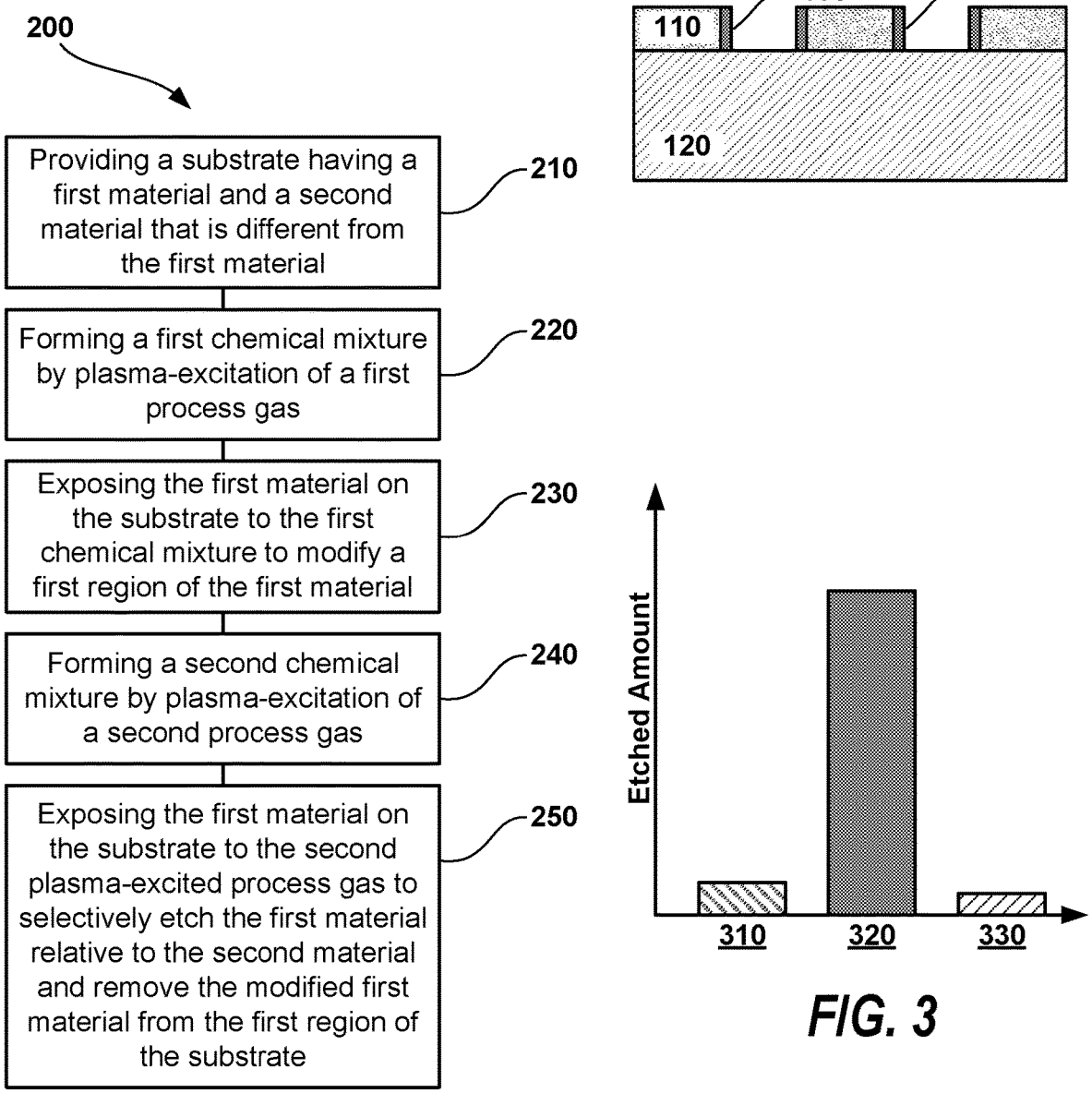
FIG. 2 provides a flow chart illustrating a method of etching a substrate according to an embodiment.

According to several embodiments, FIGS. 1 and 2 illustrate a method of etching a thin film. The method, depicted as flow chart 200, includes providing a substrate 120 having a first material 100 containing silicon oxide material and a second material 110 (or 120) that is different from the first material 100 in step 210. Substrate 120 can include a planar workpiece, such as a semiconductor workpiece or panel. Substrate 120 can also include additional layers and/or structures of varied composition. In some embodiments, a silicon nitride (e.g., $Si_3N_4$) layer may be disposed between the first and second materials 100, 110, and the substrate 120.

The method further includes forming a first chemical mixture by plasma-excitation of a first process gas containing an inert gas and at least one additional gas selected from the group consisting of He and $H_2$ in step 220, and exposing the first material 100 on the substrate 120 to the first chemical mixture to modify a first region 101 of the first material 100 in step 230, the combination of which is depicted as 102 in FIG. 1. As shown for example, the first region 101 can include surfaces of the first material 100 generally oriented parallel with the substrate plane (e.g., surfaces perpendicular to incident ion flux). During 102, the first region 101 of exposed surfaces of the first material 100 is modified to a finite depth to form a modified sub-layer. The modified sub-layer may or may not penetrate the full thickness of the first material 100.

Thereafter, the method includes forming a second chemical mixture by plasma-excitation of a second process gas containing an inert gas and an additional gas containing C, H, and F in step 240, and exposing the first material 100 on the substrate to the second plasma-excited process gas to selectively etch the first material 100 relative to the second material and remove the modified first material from the first region 101 of the substrate 120 in step 250, the combination of which is depicted as 104 in FIG. 1. During 104, the modified sub-layer in the first material 100 is exposed to the second chemical mixture and removed or etched. As a result of the removing, a second region 103 of the first material 100 remains. As shown for example, the second region 103 can include surfaces of the first material 100 generally oriented perpendicular to the substrate plane (e.g., surfaces parallel with incident ion flux).

The method can further include repeating the steps of forming the first chemical mixture (220), exposing the first material 100 to the first chemical mixture (230), forming the second chemical mixture (240), and exposing the first material 100 to the second chemical mixture (250) to incrementally remove additional portions of the first material 101. During sequence 104 (see FIG. 1), a protection layer may be formed over the exposed surfaces of the first material 100 not removed in step 250. Then, during a subsequent exposing to the first chemical mixture in sequence 102 (see FIG. 1), the protective layer over the second material 110 can be partially or fully removed.

As illustrated in FIG. 1, the second material 110 can include a mandrel pattern formed on substrate 100, wherein the mandrel pattern includes features protruding from substrate 120 separated by open spaces, and the first material 100 is conformally applied over the mandrel pattern. The first region 101 of the substrate 120 can include the top surface of the features in the mandrel pattern and the bottom surfaces of the open spaces in the mandrel pattern, wherein the removal of the modified first material from the mandrel pattern leaves the first material 100 remaining on the sidewalls of the mandrel pattern. The process sequence described above can be used to create the sidewall features on the mandrel pattern meeting target specifications for a self-aligned multi-patterning process.

The first material 100 can include silicon oxide, which may be conformally applied to a mandrel pattern. Silicon oxide can be deposited using a vapor deposition process, or other known process. The second material 110 can include a carbon-containing soft or hard mask, silicon, or Si, Ge, or a metal (M), and optionally one or more elements selected from the group consisting of O, N, C, F, Cl, Br, and S. For example, the second material 110 can include silicon, silicon oxide, silicon carbide, metal, metal oxide, metal nitride, metal carbide, or metal alloy, or combinations thereof. Additionally, for example, the second material 110 can include a Si-containing anti-reflective coating (ARC), silicon or silicon oxide.

The first process gas can include two different noble gas elements, or a noble gas element and hydrogen-containing gas. The first process gas can include of Ar and He, or $H_2$ and an optional noble gas. Alternatively, the first process gas can consist essentially of Ar and He, or Ar and $H_2$. Alternatively yet, the first process gas can consist of Ar and He, or Ar and $H_2$.

The second process gas can include a partially substituted halosilane, such as a compound of the form $C_xH_yF_z$, and x, y, and z are integers greater than 0. In one embodiment, the second process gas contains $CHF_3$, and optionally an inert gas. Alternatively, the second process gas consists of $CHF_3$ and Ar.

Figure 3:
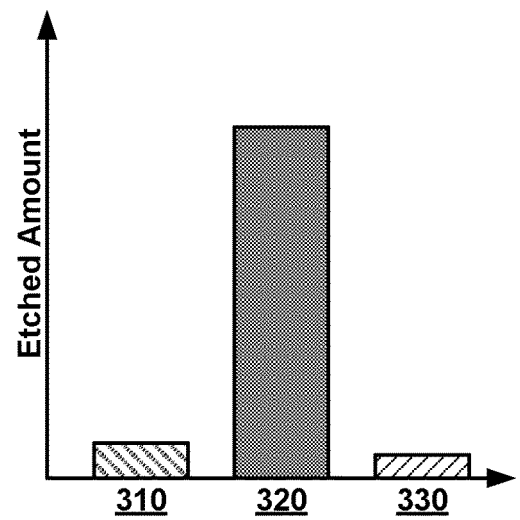
FIG. 3 provides exemplary data for etching a substrate according to an embodiment.

As an example, FIG. 3 illustrates the amount of silicon oxide etched during a specified etch time. In 310, a silicon oxide layer is exposed to a hydrogen ($H_2$) plasma only. In 320, a silicon oxide layer is exposed to a two-step sequence, as described above, wherein the first step includes a hydrogen ($H_2$) plasma, and the second step includes a $CHF_3$ plasma. In 330, a silicon oxide layer is exposed to a $CHF_3$ plasma only. Other process conditions, including pressure, temperature, plasma/bias power(s), etc., are held constant. The inventors have observed a substantially greater etch rate in the multi-step process (i.e., 320).

Figure 4A:
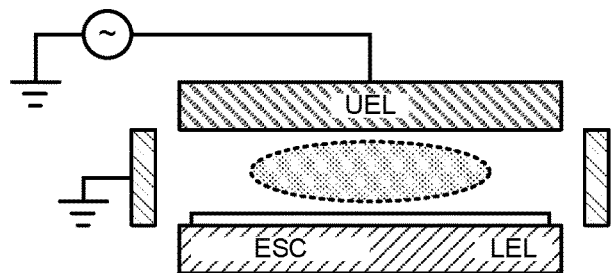
FIGS. 4A through 4D provide schematic illustrations of plasma processing systems for performing the method of etching according to various embodiments.

The plasma-excitation of the first process and/or the second process gas can be performed in-situ (i.e., the first and/or second chemical mixture is formed within a gas-phase, vacuum environment in proximate contact with the substrate), or ex-situ (i.e., the first and/or second chemical mixture is formed within a gas-phase, vacuum environment remotely located relative to the substrate). FIGS. 4A through 4D provide several plasma generating systems that may be used to facilitate plasma-excitation of a process gas. FIG. 4A illustrates a capacitively coupled plasma (CCP) system, wherein plasma is formed proximate a substrate between an upper plate electrode (UEL) and a lower plate electrode (LEL), the lower electrode also serving as an electrostatic chuck (ESC) to support and retain the substrate. Plasma is formed by coupling radio frequency (RF) power to at least one of the electrodes. As shown in FIG. 4A, RF power is coupled to both the upper and lower electrodes, and the power coupling may include differing RF frequencies. Alternatively, multiple RF power sources may be coupled to the same electrode. Moreover, direct current (DC) power may be coupled to the upper electrode.

Figure 4B:
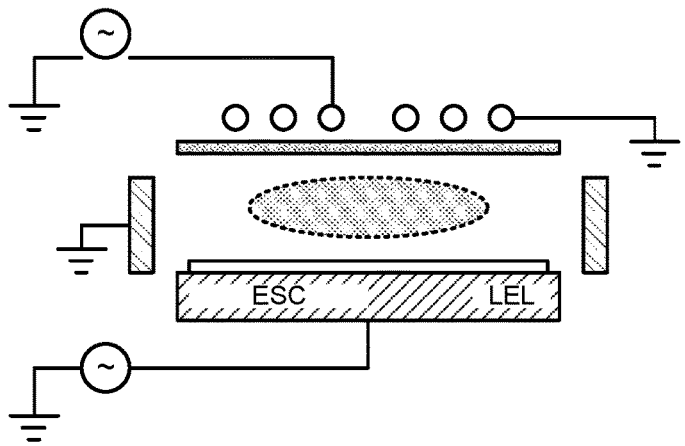

FIG. 4B illustrates an inductively coupled plasma (ICP) system, wherein plasma is formed proximate a substrate between an inductive element (e.g., a planar, or solenoidal/helical coil) and a lower plate electrode (LEL), the lower electrode also serving as an electrostatic chuck (ESC) to support and retain the substrate. Plasma is formed by coupling radio frequency (RF) power to the inductive coupling element. As shown in FIG. 4B, RF power is coupled to both the inductive element and lower electrode, and the power coupling may include differing RF frequencies.

Figure 4C:
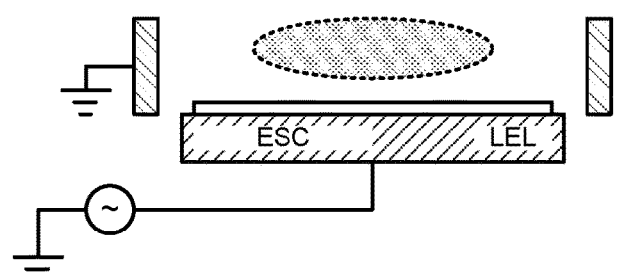

FIG. 4C illustrates a surface wave plasma (SWP) system, wherein plasma is formed proximate a substrate between a slotted plane antenna and a lower plate electrode (LEL), the lower electrode also serving as an electrostatic chuck (ESC) to support and retain the substrate. Plasma is formed by coupling radio frequency (RF) power at microwave frequencies through a waveguide and coaxial line to the slotted plane antenna. As shown in FIG. 4C, RF power is coupled to both the slotted plane antenna and lower electrode, and the power coupling may include differing RF frequencies.

Figure 4D:
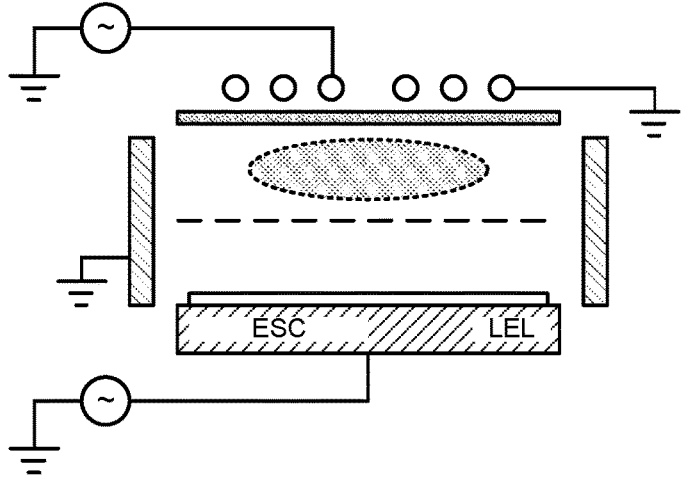

FIG. 4D illustrates remote plasma system, wherein plasma is formed in a region remote from a substrate and separated from the substrate by a filter arranged to impede the transport of charged particles from the remote plasma source to a processing region proximate the substrate. The substrate is supported by a lower plate electrode (LEL) that also serves as an electrostatic chuck (ESC) to retain the substrate. Plasma is formed by coupling radio frequency (RF) power to a plasma generating device adjacent the remotely located region. As shown in FIG. 4D, RF power is coupled to both the plasma generating device adjacent the remote region and lower electrode, and the power coupling may include differing RF frequencies.

The plasma processing systems of FIGS. 4A through 4D are intended to be illustrative of various techniques for implementing the stepped ion/radical process described. Other embodiments are contemplated including both combinations and variations of the systems described.

When forming the first chemical mixture by plasma-excitation of the first process gas, and exposing the first material on the substrate to the first chemical mixture, the gas pressure for the exposing can be less than or equal to 1000 mTorr. For example, the gas pressure may range from 10 mTorr to 100 mTorr. Additionally, the substrate may be electrically biased by coupling RF power to the lower plate electrode (LEL). RF power may or may not also be applied to the plasma generating device.

When forming the second chemical mixture by plasma-excitation of the second process gas, and exposing the second material on the substrate to the second chemical mixture, the gas pressure for the exposing can be less than or equal to 1000 mTorr. For example, the gas pressure may range from 10 mTorr to 100 mTorr. Additionally, the substrate may be electrically biased by coupling RF power to the lower plate electrode (LEL). RF power may or may not also be applied to the plasma generating device.

When forming the first chemical mixture by plasma-excitation of the first process gas, and exposing the first material on the substrate to the first chemical mixture, and when forming the second chemical mixture by plasma-excitation of the second process gas the inventors have observed a cyclic plasma etch that results in precise profile control of a spacer feature formed on a mandrel pattern sidewall.

In the claims below, any of the dependents limitations can depend from any of the independent claims.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of etching, comprising:
providing a substrate having a first material containing silicon oxide material and a second material that is different from the first material;
forming a first chemical mixture by plasma-excitation of a first process gas containing an inert gas and at least one additional gas selected from the group consisting of He and $H_2$;
exposing the first material on the substrate to the first chemical mixture to modify a first region of the first material;
thereafter, forming a second chemical mixture by plasma-excitation of a second process gas containing an inert gas and an additional gas containing C, H, and F; and
exposing the first material on the substrate to the second plasma-excited process gas to selectively etch the first material relative to the second material and remove the modified first material from the first region of the substrate.

2. The method of claim 1, wherein the first material is conformally applied to a mandrel pattern formed on the substrate, the mandrel pattern including features protruding from the substrate separated by open spaces.

3. The method of claim 2, wherein the first region of the substrate includes the top surface of the features in the mandrel pattern and the bottom surfaces of the open spaces in the mandrel pattern, and wherein the removal of the modified first material from the mandrel pattern leaves the first material remaining on the sidewalls of the mandrel pattern.

4. The method of claim 1, wherein the first process gas consists of Ar and He, or Ar and $H_2$.

5. The method of claim 1, wherein the second process gas includes a compound of the form $C_xH_yF_z$, and x, y, and z are integers greater than 0.

6. The method of claim 1, wherein the second process gas contains $CHF_3$.

7. The method of claim 1, wherein the second process gas consists of $CHF_3$ and Ar.

8. The method of claim 1, wherein the first material includes silicon oxide conformally applied to a pattern mandrel.

9. The method of claim 1, wherein the second material includes a carbon-containing soft or hard mask.

10. The method of claim 1, wherein the second material includes silicon.

11. The method of claim 1, wherein the second material includes Si, Ge, or a metal (M), and optionally one or more elements selected from the group consisting of O, N, C, F, Cl, Br, and S.

12. The method of claim 1, wherein the second material includes silicon, silicon oxide, silicon carbide, metal, metal oxide, metal nitride, metal carbide, or metal alloy, or combinations thereof.

13. The method of claim 1, wherein the second material includes a Si-containing anti-reflective coating (ARC), silicon or silicon oxide.

14. The method of claim 1, further comprising:
modifying exposed surfaces of the first material to a finite depth to form a modified sub-layer in the first material during the exposing to the first chemical mixture; and
etching the modified sub-layer in the first material during the exposing to the second chemical mixture.

15. The method of claim 14, further comprising:
forming a protection layer over the second material during the exposing to the second chemical mixture.

16. The method of claim 15, further comprising:
removing the protection layer over the second material during the exposing to the first chemical mixture.

17. The method of claim 1, wherein the plasma excitation of the first process gas or the second process gas includes generating plasma using a capacitively coupled plasma source containing an upper plate electrode, and a lower plate electrode supporting the substrate.

18. The method of claim 1, wherein the plasma excitation of the first process gas or the second process gas includes generating plasma using an inductively coupled plasma source containing an inductive element, and a lower plate electrode supporting the substrate.

19. The method of claim 1, wherein the plasma excitation of the first process gas or the second process gas includes generating plasma using a remote plasma source.

20. The method of claim 1, further comprising:
repeating the steps of forming the first chemical mixture, exposing the first material to the first chemical mixture, forming the second chemical mixture, and exposing the first material to the second chemical mixture to incrementally remove additional portions of the first material.

* * * * *